(12) United States Patent
Senga et al.

(10) Patent No.: US 9,031,687 B2
(45) Date of Patent: May 12, 2015

(54) METHOD FOR PREDICTING WORKED SHAPE, METHOD FOR DETERMINING WORKING CONDITIONS, WORKING METHOD, WORKING SYSTEM, SEMICONDUCTOR DEVICE MANUFACTURING METHOD, COMPUTER PROGRAM AND COMPUTER PROGRAM STORAGE MEDIUM

(75) Inventors: Tatsuya Senga, Kawasaki (JP); Akira Ishikawa, Kawasaki (JP); Takehiko Ueda, Tokyo (JP)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 12/749,306

(22) Filed: Mar. 29, 2010

(65) Prior Publication Data

US 2010/0233937 A1 Sep. 16, 2010

Related U.S. Application Data

(62) Division of application No. 10/470,537, filed as application No. PCT/JP02/00182 on Jan. 15, 2002, now Pat. No. 7,686,673.

(30) Foreign Application Priority Data

Jan. 31, 2001 (JP) .................................. 2001-024882
Sep. 5, 2001 (JP) .................................. 2001-268610

(51) Int. Cl.
*H01L 21/66* (2006.01)
*B24B 49/04* (2006.01)
(Continued)

(52) U.S. Cl.
CPC ................ *H01L 22/26* (2013.01); *B24B 49/04* (2013.01); *B24B 37/042* (2013.01); *B24B 49/00* (2013.01); *H01L 21/3212* (2013.01)

(58) Field of Classification Search
CPC .................................................. G03F 6/70358
USPC ................... 451/5, 8, 41, 285, 286; 438/691; 703/1–2, 6; 700/29, 32, 53, 201, 110, 700/123, 164, 174–175, 302
See application file for complete search history.

(56) References Cited

U.S. PATENT DOCUMENTS 5,460,034 A * 10/1995 Herrick .......................... 73/105
(Continued)

FOREIGN PATENT DOCUMENTS

JP         10-44028         2/1998
(Continued)

OTHER PUBLICATIONS

Wang et al. (New Optimization Strategy for Chemical Mechanical Polishing Processes, JSME International Journal, 2001).*
(Continued)

*Primary Examiner* — Darrin Dunn
(74) *Attorney, Agent, or Firm* — Morgan, Lewis & Bockius LLP

(57) ABSTRACT

The relationship between polishing conditions constituting elements and the worked shape (amount of polishing) obtained by means of these polishing conditions is input beforehand into polishing condition determining means along with the type of the object of polishing, and polishing conditions (invariable polishing conditions) that are used in common for the polishing of this object of polishing. The polishing condition determining means determine the polishing conditions on the basis of these conditions. Specifically, the above-mentioned polishing conditions constituting elements are given in a time series, or combinations of the above-mentioned polishing conditions constituting elements are converted into variations in the swinging velocity of the polishing body, and the swinging velocity corresponding to the swinging position is determined. The polishing apparatus control means input the polishing conditions determined by the polishing condition determining means, and control the polishing apparatus so that these polishing conditions are realized. As a result, working conditions for obtaining a specified worked shape in a working apparatus can be simply and accurately determined.

6 Claims, 12 Drawing Sheets

(51) Int. Cl.
  *B24B 37/04* (2012.01)
  *B24B 49/00* (2012.01)
  *H01L 21/321* (2006.01)

(56) References Cited

U.S. PATENT DOCUMENTS

| | | | |
|---|---|---|---|
| 5,599,423 A * | 2/1997 | Parker et al. | 438/692 |
| 6,241,847 B1 | 6/2001 | Allman et al. | 156/636.1 |
| 6,271,047 B1 * | 8/2001 | Ushio et al. | 438/14 |
| 6,290,572 B1 * | 9/2001 | Hofmann | 451/5 |
| 6,449,524 B1 * | 9/2002 | Miller et al. | 700/121 |
| 6,520,845 B2 | 2/2003 | Hirokawa et al. | 451/287 |
| 6,594,542 B1 * | 7/2003 | Williams | 700/164 |
| 6,670,200 B2 | 12/2003 | Ushio et al. | 438/14 |
| 6,821,794 B2 | 11/2004 | Laursen et al. | 438/8 |
| 6,889,177 B1 * | 5/2005 | Runnels | 703/2 |
| 2002/0013122 A1 * | 1/2002 | Sugaya et al. | 451/41 |
| 2003/0087459 A1 | 5/2003 | Laursen et al. | 438/8 |
| 2004/0053558 A1 | 3/2004 | Senga et al. | 451/5 |

FOREIGN PATENT DOCUMENTS

| | | |
|---|---|---|
| JP | 11-74235 | 3/1999 |
| JP | 11-126765 | 5/1999 |
| JP | H11-207607 | 8/1999 |
| JP | 2000-24914 | 1/2000 |
| JP | 2001-219369 | 8/2001 |
| JP | 2001-237206 | 8/2001 |

OTHER PUBLICATIONS

Lin et al. (Application of an Adaptive Neuro-Fuzzy Inference System for the Optimal Analysis of Chemical Mechanical Polishing Process Parameters, J Adv Manuf Technol (2001)).*

An English language translation of Japanese Office Action issued in Japanese Patent Application No. 2001-268610 on Jan. 25, 2011 is being submitted. The Japanese language Office Action was submitted on Dec. 12, 2014.

An English language translation of Japanese Office Action issued in Japanese Patent Application No. 2001-268610 on Aug. 23, 2011. The Japanese language Office Action was submitted on Dec. 12, 2014.

* cited by examiner

Fig. 11
(a)
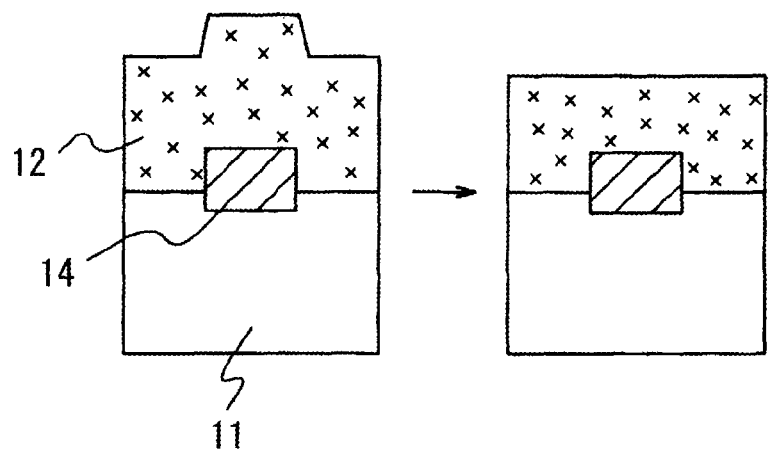
(b)
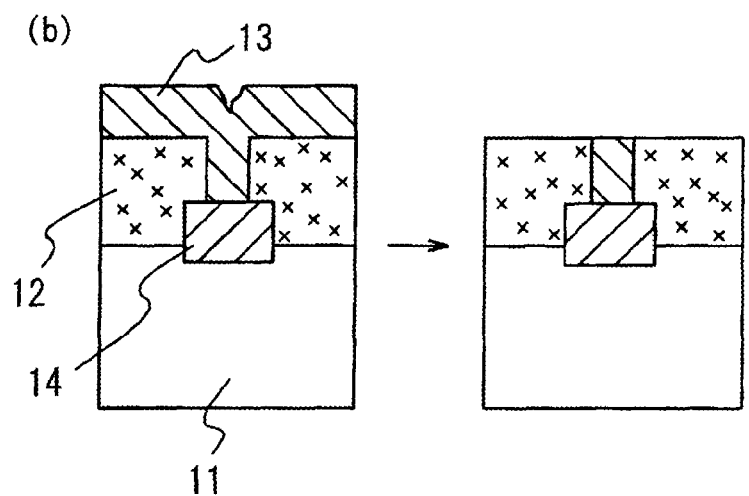

METHOD FOR PREDICTING WORKED SHAPE, METHOD FOR DETERMINING WORKING CONDITIONS, WORKING METHOD, WORKING SYSTEM, SEMICONDUCTOR DEVICE MANUFACTURING METHOD, COMPUTER PROGRAM AND COMPUTER PROGRAM STORAGE MEDIUM

This application is a Divisional of Copending U.S. patent application Ser. No. 10/470,537, filed on Jul. 30, 2003, and claims priority to Japanese Application Nos. 2001-24882 and 2001-268610, filed on Jan. 31, 2001 and Sep. 5, 2001, respectively, all of which are hereby incorporated by reference in their entirety.

TECHNICAL FIELD

The present invention relates to a method for predicting the worked shape that is obtained in cases where an object of working is worked, a method for determining the working conditions under which this object of working is worked, a working method for working this object of working, a working system for working this object of working, a semiconductor device manufacturing method using this working method and working system, a computer program which performs the method for determining working conditions, and a computer program storage medium on which this computer program is stored. Furthermore, the term "working" used in the present specification and claims refers to mechanical working such as polishing and grinding.

BACKGROUND TECHNOLOGY

As semiconductor integrated circuits have become finer and more highly integrated, the individual processes involved in semiconductor manufacturing processes have become more numerous and complicated. As a result, the surfaces of semiconductor devices are not always flat. The presence of step differences on the surfaces of semiconductor devices leads to step breakage of wiring and local increases in resistance, etc., and thus causes wiring interruptions and drops in electrical capacitance. In insulating films, furthermore, such step differences also lead to a deterioration in the withstand voltage and the occurrence of leaks.

Meanwhile, as semiconductor integrated circuits have become finer and more highly integrated, the wavelengths of light sources in semiconductor exposure apparatuses used in photolithography have become shorter, and the numerical aperture or so-called NA of the projection lenses used in such semiconductor exposure apparatuses has become larger. As a result, the focal depth of the projection lenses used in such semiconductor exposure apparatuses has become substantially shallower. In order to deal with such increasing shallowness of the focal depth, there is a demand for even greater planarization of the surfaces of semiconductor devices than that achieved so far.

To describe this in concrete terms, planarization techniques such as that shown in FIG. 11 have become essential in semiconductor manufacturing processes. A semiconductor device 14, an inter-layer insulating film 12 consisting of $S_iO_2$, and a metal film 13 consisting of Al are formed on the surface of a wafer 11. FIG. 11(a) shows an example of the planarization of an inter-layer insulating film 12 on the surface of the semiconductor device. FIG. 11(b) shows an example in which a so-called damascene is formed by polishing the metal film 13 on the surface of the semiconductor device.

A chemical mechanical polishing or chemical mechanical planarization (hereafter referred to as "CMP") technique is widely used as a method for planarizing the surfaces of such semiconductor devices. Currently, the CMP technique is the sole method that can be used to planarize the entire surface of a wafer.

CMP was developed on the basis of wafer mirror surface polishing methods. FIG. 12 is a schematic structural diagram of a polishing (planarization) apparatus used in CMP. This polishing apparatus is constructed from a polishing member 15, a polishing object holding part (this may hereafter be referred to as a "polishing head") 16, and a polishing agent supply part 18. Furthermore, a wafer 17 which constitutes the object of polishing is attached to the polishing head 16, and the polishing agent supply part 18 supplies a polishing agent (slurry) 19. The polishing member 15 is a member in which a polishing body (this may hereafter be referred to as a "polishing pad") 21 is pasted to a platen 20.

The wafer 17 is held by the polishing head 16, and is caused to swing while being rotated; furthermore, the wafer 17 is pressed against the polishing body 21 of the polishing member 15 with a specified pressure. The polishing member 15 is also caused to rotate, so that a relative motion is caused to take place between the polishing member 15 and the wafer 17. In this state, a polishing agent 19 is supplied to the surface of the polishing body 21 from the polishing agent supply part 18. This polishing agent 19 diffuses over the surface of the polishing body 21, and enters the space between the polishing body 21 and the wafer 17 as relative motion occurs between the polishing member 15 and wafer 17, so that the polished surface of the wafer 17 is polished. Specifically, favorable polishing is performed as a result of a synergistic effect between mechanical polishing caused by the relative motion of the polishing member 15 and wafer 17 and the chemical action of the polishing agent 19.

FIG. 13 is a schematic diagram which shows another polishing apparatus. In this polishing apparatus, the polishing head 16 is on the lower side, and the wafer 17 is chucked above this polishing head 16. Furthermore, the polishing body 21 has a smaller diameter than the wafer 17, and is pasted to a polishing platen 20 which is installed above. Specifically, the polishing body 21 swings while being caused to rotate together with the polishing platen 20, and is pressed against the wafer 17 with a specified pressure. The polishing head 16 and wafer 17 are also caused to rotate, so that a relative motion is created between the wafer 17 and the polishing body 21. In this state, a polishing agent 19 is supplied to the surface of the wafer 17 from the polishing agent supply part 18; this polishing agent 19 diffuses over the surface of the wafer 17, and enters the space between the polishing body 21 and the wafer 17 as relative motion takes place between the polishing member 15 and wafer 17, so that the polished surface of the wafer 17 is polished.

However, there are many different types of wafers that are polished, and independent polishing conditions (a polishing recipe) must be set according to the respective types of wafers.

For example, in the case of polishing through a multi-layer structure such as Cu damascene, Cu is ordinarily polished by primary polishing, and Ta is polished by secondary polishing. In this case, the uniformity of polishing varies greatly even under the same polishing conditions, as a result of differences in the polishing agent and object of polishing. Accordingly, such a method involves the trouble of setting the polishing conditions anew for each polishing operation. Furthermore, in the case of metal polishing, it is necessary to add an oxidizing agent such as hydrogen peroxide in addition to the polishing agent, and the polishing profile varies according to the amount of this additive even in the case of the same polishing agent. Accordingly, the polishing conditions must be varied in all cases when there is a change in the type of polishing agent, additive or object of polishing.

Polishing conditions include the type of polishing liquid, type of polishing pad, rotational speed of the polishing head and polishing member, swinging speed of the polishing head, and pressing pressure of the polishing head, etc. In the case of the rotational speed of the polishing head and polishing member, swinging speed of the polishing head, and pressing pressure of the polishing head, these conditions are a function of time and a function of the polishing head position.

Conventionally, a method in which the polishing conditions that produce the desired worked shape are discovered by performing test polishing based on trial and error on the basis of experience has been used as a method for setting the polishing conditions in accordance with the type of wafer involved. Numerous wafers are used in this test polishing, and considerable time is required in order to determine the polishing conditions.

Furthermore, even if the type of wafer is specified, and the standard polishing conditions are found, the surface shape prior to polishing of wafers that are actually polished varies according to the production lot. Accordingly, it is necessary to perform further test polishing for each production lot, and to make fine adjustments in the polishing conditions. However, even if such fine adjustments are thus made for each production lot, a problem remains in that variation within lots cannot be handled.

In conventional polishing apparatuses in which the polishing body is larger than the wafer being polished, the following problem arises: namely, the size of the apparatus itself increases as the diameter of the wafer increases. Another drawback is that the replacement of consumed parts that require replacement, such as the polishing pad, is extremely difficult because of its large size. Moreover, in cases where there are indentations and projections in the surface of the wafer prior to polishing due to irregularities in film formation, it is extremely difficult to polish the surface to a flat surface by the appropriate treatment of such indentations and projections. In addition, in the case of wafers in which the initial film shape is an "M" shape or "W" shape as a result of the film formation process, there may be instances in which it is necessary to polish the remaining film to a uniform shape. In the case of conventional polishing apparatuses, it is difficult to meet such demands.

Recently, polishing apparatuses using a polishing body that is smaller than the polished wafer have been developed and used as polishing apparatuses that solve such polishing apparatus problems. Since the polishing body is small in such polishing apparatuses, these polishing apparatuses are advantageous in that the size of the polishing parts in the polishing apparatus can be reduced. Furthermore, in regard to the replacement of consumed parts as well, since the parts have a small size, this replacement work itself is extremely easy.

Furthermore, in the case of such polishing apparatuses using a polishing body that is smaller than the polished wafer, the polishing profile can be freely varied by varying the probability of the polishing body being present on respective portions of the surface of the wafer. Accordingly, cases in which indentations and projections are present in the surface of the wafer prior to polishing can be handled.

However, the fact that such fine adjustments are possible means that the polishing conditions must be determined more precisely. Specifically, the number of polishing conditions is increased, and at the same time, the polishing conditions become more complicated; furthermore, the frequency with which the polishing conditions must be determined is increased, and more wafers and time are required for the determination of a single polishing condition. Moreover, even in cases where fine adjustments are not required, since the polishing body is small, the polishing conditions are still complicated compared to those in a conventional polishing apparatus using a large polishing body.

Specifically, in the case of polishing using a small-diameter pad, variable-speed swinging must be added besides the rotation in order to vary the probability of the pad being present on the wafer surface, and it is necessary to perform load control in which the load is lowered in order to suppress a rise in the polishing rate at the edges of the wafer. Accordingly, as a result of the addition of such control actions, the complexity of the polishing conditions is greatly increased.

A method in which the polishing conditions are determined by simulation has been developed as one solution to the problem of considerable time being required for the determination of the polishing conditions. However, in the polishing process, the polishing body undergoes elastic deformation, and the flow of the polishing agent between the polishing body and the object of polishing is complicated; furthermore, frictional heat is generated during polishing. As a result, it is difficult to express the overall polishing process in terms of numerical equations, so that a numerical model with general applicability has not yet been obtained.

DISCLOSURE OF THE INVENTION

The present invention was devised in light of the above facts; the object of the present invention is to provide a worked shape prediction method which allows the simple and accurate prediction of the worked shape that is obtained in cases where working is performed under specified working conditions in a working apparatus (such as a polishing apparatus), a method for determining working conditions which allows the simple and accurate determination of the working conditions used to obtain a specified worked shape in such a working apparatus, a working method for obtaining a specified worked shape in such a working apparatus, a working system which allows such a predicted worked shape to be easily obtained, a semiconductor device manufacturing method using this working system, a computer program which realizes the above-mentioned method for determining working conditions, and a computer program storage medium which stores this computer program.

The first invention of the present application is a method for predicting the worked shape that is obtained in cases where an object of working is worked by causing relative motion to take place between a tool and the above-mentioned object of working in a sate in which abrasive grains are interposed between the above-mentioned tool and object of working, this worked shape prediction method being characterized by the fact that the relationship between working conditions that constitute elements and the elements of the worked shape that is obtained when working is performed under these working conditions is determined in advance, and when specified working conditions are given, these working conditions are broken down into combinations of working conditions constituting the above-mentioned elements, and the sum of the worked shape elements that are obtained by means of the above-mentioned combinations is taken as the predicted worked shape that will be obtained when working is performed under the above-mentioned specified working conditions.

In the present invention, simple working conditions are taken as single elements, and the worked shape elements that are obtained when working is performed under these working conditions are determined in advance. These worked shape elements may be determined by actual measurement, or may be determined by simulated calculations. A plurality of such working conditions constituting elements are prepared. Then, when specified working conditions are given, these working conditions are broken down in to a plurality of combinations of the above-mentioned working conditions constituting the above-mentioned elements, and the worked shape that is obtained when working consisting of these combinations is performed, i.e., the sum of the worked shape elements, is predicted as the worked shape that will be obtained by a plurality of combinations of working conditions constituting selected elements.

Specifically, complicated working conditions are viewed as combinations of simple working conditions, and the worked shape is predicted. Accordingly, worked shapes obtained by complicated working conditions can be simply predicted. In particular, more accurate predictions of the worked shape can be made in cases where worked shapes obtained by working conditions constituting the above-mentioned elements are obtained by actual measurement.

Parameters that determine the worked shape include the amount of working, the uniformity of the amount of working, the uniformity of the remaining film thickness, the degree of similarity to the target shape, the sum of the squares of the differences from the target shape, and values integrated for position, with weighting based on the position applied to the differences from the target shape, etc. Furthermore, several of these parameters may be evaluated in combination.

In the first invention of the present application, it is desirable that the above-mentioned worked shape elements be subjected to a Fourier transform, that the sum of the worked shape elements determined using the above-mentioned combinations be determined as the sum of the Fourier-transformed functions for these combinations, and that the predicted worked shape be obtained by subjecting the results to an inverse Fourier transform.

In most cases, the worked shape elements have a periodicity with respect to the position of the object of working or the position of the tool. Accordingly, if these elements are subjected to a Fourier transform with respect to the position of the object of working or the position of the tool, a simple shape is often obtained. Consequently, the predicted shape can be obtained simply and accurately if the worked shape elements are temporarily subjected to a Fourier transform with respect to the position of the object of working or the position of the tool, these Fourier-transformed functions are combined in accordance with combinations of the worked shape elements (in concrete terms, added with a weight applied according to the working conditions that constitute the elements), and the predicted shape is determined by subjecting the sum of these functions to an inverse Fourier transform.

Furthermore, a greater effect is obtained if the present invention is used in cases where the above-mentioned object of working is larger than the above-mentioned tool.

Specifically, as was described above, in a working apparatus in which the object of working is larger than the tool, the working conditions become complicated, so that prediction of the worked shape that is obtained becomes more difficult. Accordingly, a greater effect can be obtained by applying the present invention.

The second invention of the present application is a method for determining the working conditions that will work the object of working into a specified shape in a working apparatus in which such an object of working is worked by causing relative motion to take place between a tool and the above-mentioned object of working in a state in which abrasive grains are interposed between this tool and object of working, this method for determining working conditions being characterized by the fact that the relationship between working conditions constituting elements and the elements of the worked shape that is obtained when working is performed under these working conditions is determined beforehand, combinations of the above-mentioned working conditions constituting elements which are such that the combinations of the above-mentioned worked shape elements approach the above-mentioned specified shape are determined, and these combinations are taken as the working conditions.

In the present invention, as in the above-mentioned first invention, simple working conditions are taken as single elements, the worked shape elements that are obtained when working is performed under these working conditions are determined, and a plurality of such working conditions that constitute elements are prepared in advance. Then, when the target worked shape is given, this is broken down into combinations of the above-mentioned worked shape elements, and combinations of worked shape elements are determined which are such that the worked shape obtained by means of the above-mentioned combinations approaches the above-mentioned target worked shape.

Here, the term "approaches the worked shape" refers to the fact of being included within a worked shape tolerance range. Furthermore, the term "worked shape" refers not only to the worked shape that is finally obtained, but is a concept that also includes combinations of initial shapes and final shapes that indicate what kind of final shape is to be worked from what kind of initial shape (i.e., which positions are to be polished, and by how much); this is a quantity that corresponds to the amount of working in each position of the object of working.

Parameters that determine the working conditions include the amount of working, the uniformity of the amount of working, the uniformity of the remaining film thickness, the degree of similarity to the target shape, the sum of the squares of the differences from the target shape, and values integrated for position, with weighting based on the position applied to the differences from the target shape, etc. Furthermore, several of these parameters may be evaluated in combination.

One conceivable example of a method for determining combinations which are such that the combinations of the worked shape elements approach the target worked shape is a method in which random numbers are generated, combinations of working conditions that constitute elements are determined on the basis of these random numbers, the worked shape as a whole is determined by means of combinations of worked shape elements (weighted sum) obtained by means of these combinations of working conditions, and if combinations which are such that the worked shape is within the tolerance range are obtained, these combinations are used. Furthermore, worked shape elements obtained by means of working conditions constituting elements may be converted into functions, and combinations of working conditions constituting elements may be determined utilizing the method of least squares.

In the present invention, even if the target worked shape is complicated, the corresponding working conditions can be determined as combinations of simple worked shapes constituting elements. Accordingly, the working conditions can be determined by a simple simulation compared to conventional methods in which the working conditions are determined by trial and error relying on human intuition. Consequently, the number of objects of working required for test working can be reduced, and the adjustment time can be considerably shortened. Moreover, the working conditions can be appropriately set even in cases where a complicated worked shape is required, so that the working precision can be improved.

In the present invention as well, it is desirable that the above-mentioned worked shape elements be subjected to a Fourier transform, that the above-mentioned specified shape be subjected to a Fourier transform, that combinations of the above-mentioned working conditions constituting elements which are such that the combinations of the Fourier-transformed values of the worked shape elements approach the Fourier-transformed value of the above-mentioned specified shape be determined, and that these combinations be taken as the working conditions.

In most cases, as was described above, the worked shape elements have a periodicity with respect to the position of the object of working or the position of the tool. Accordingly, if these elements are subjected to a Fourier transform with respect to the position of the object of working or the position of the tool, a simple shape is usually obtained. In most cases, furthermore, the above-mentioned specified shape also has a periodicity with respect to the position of the object of working or the position of the tool; accordingly, if this shape is subjected to a Fourier transform with respect to the position of the object of working or the position of the tool, a simple shape is usually obtained. Consequently, the working conditions can be simply and accurately determined by using the following method: specifically, both of these values are first subjected to a Fourier transform, combinations of the above-mentioned working conditions constituting elements which are such that the combinations of the Fourier-transformed values of the worked shape elements approach the Fourier-transformed value of the above-mentioned specified shape are determined, and these combinations are taken as the working conditions. Here, the term "approach" refers to the fact of being included in the tolerance range of the worked shape.

In the present invention, it is desirable that the above-mentioned combinations of working conditions that constitute elements be combinations in which the respective working conditions constituting elements are combined in a time series.

Specifically, the working conditions as a whole are determined by combining respective working conditions constituting elements in a time series. The desired worked shape is obtained if working conditions constituting elements are combined in a time series, for example, as follows: working is performed for a certain period of time under a working condition constituting a first element, after which working is performed under a working condition constituting a third element for a certain period of time, and working is further performed under a working condition constituting an eighth element for a certain period of time. In the present means, the system may be arranged so that the desired worked shape can be obtained by combining simple working conditions in actual working as well. In this case, furthermore, it is not absolutely necessary that working conditions that constitute single elements be applied at one time; such working conditions can be split and applied a multiple number of times.

Furthermore, in the present invention, it is desirable that the working conditions obtained by means of combinations of the above-mentioned working conditions constituting elements be working conditions obtained by weighting and combining the respective working conditions constituting elements.

Specifically, single working conditions are obtained by weighting and combining respective working conditions that constitute elements. It is assumed that when the ith working condition is applied for g(i), for example, a result is obtained which is such that the target worked shape is produced by the combination of such working conditions. In the before-mentioned method, a time series arrangement of working conditions was obtained by distributing g(i) as a time; in the present method, however, such working conditions are spatially distributed For example, assuming that the working time of the object of working in position x under the ith working condition (i.e., the time for which the tool is present in this position) is t(x), then the swinging speed and swinging frequency of the tool are determined so that the working time of the object of working in position x is as follows:

$$T(x) = \sum_i g(i)t(x) \qquad (1)$$

If this is done, the control of the working apparatus becomes more complicated; however, the system can be devised so that the desired worked shape can be obtained by continuous working. Furthermore, this method is characterized by the fact that the apparent working conditions are simplified, and the method is also resistant to external perturbations in the operation of the apparatus.

In this case, furthermore, it is desirable that the working conditions obtained by combining the above-mentioned working conditions that constitute elements be taken as functions of the swinging position of the above-mentioned tool or the above-mentioned object of working.

The control of the working apparatus can be facilitated by expressing the combinations of the above-mentioned working conditions that constitute elements as functions of the swinging position of the above-mentioned tool or the above-mentioned object of working.

Furthermore, it is even more desirable that the combinations of the above-mentioned working conditions that constitute elements consist of combinations obtained by combining respective working conditions that constitute elements in time series, and combinations obtained by applying weighting and combining respective working conditions that constitute elements.

Specifically, by using the two desirable methods described above in combination, the special features of both methods are utilized, so that the working conditions can be determined more accurately.

Furthermore, it is desirable that combinations of the above-mentioned working conditions that constitute elements be determined so that the combination of the above-mentioned worked shape elements approach the above-mentioned specified shape, that working be performed using these combinations as the working conditions, that the error between the actual worked shape and the above-mentioned specified shape be determined, and that working conditions obtained by adding combinations of worked shape elements that compensate for this error to the above-mentioned combinations of worked shape elements be taken as the new working conditions.

If this is done, working is actually performed under the determined working conditions, and the error between the specified shape that constitutes the target and the actual worked shape is determined. Then, combinations of working conditions constituting elements that will work the amount of this error are determined, and these combinations are added to the original working conditions so that new combinations of working conditions are determined. As a result of feedback being performed in this manner, the error in the prediction of the working conditions can be corrected, so that accurate working conditions can be determined. Furthermore, by repeating such feedback, it is possible to cause the working conditions to converge on more accurate working conditions.

Moreover, as was described above, the working conditions are complicated in a working apparatus in which the object of working is larger than the tool, so that it is difficult to predict the worked shape that will be obtained. Accordingly, a greater effect can be obtained by applying the present invention to such a working apparatus.

The third invention of the present application is a working method in which an object of working is worked by causing relative motion to take place between a tool and this object of working in a state in which abrasive grains are interposed between this tool and object of working, this working method being characterized by the fact that the working conditions are determined on the basis of the second invention or a desirable aspect of the second invention.

The fourth invention of the present application is a working system using a working apparatus in which an object of working is worked by causing relative motion to take place between a tool and this object of working in a state in which abrasive grains are interposed between this tool and object of working, this working system being characterized by the fact that the system has means for inputting the surface shape of the above-mentioned object of working prior to working, and the target surface shape of the above-mentioned object of working+following working, means for determining the working conditions using the second invention or a desirable aspect of the second invention, and means for controlling the above-mentioned working apparatus in accordance with the determined working conditions.

In the present invention, the surface shape of the object of working prior to working and the target surface shape of the object of working following working can be input by the input means. The input means that input the surface shape of the object of working prior to working may be means that measure and automatically input the surface shape, means in which the surface shape is input from a higher computer, or means in which the surface shape is manually input. The target surface shape of the object of working following working is ordinarily input manually, or provided from a higher computer. When such input is performed, the means for determining the working conditions automatically determine the working conditions using an algorithm based on the method of the second invention for determining the working conditions. In this case, working conditions that do no vary, such as the type of the object of working and the slurry used, are either manually input or supplied from a higher computer to the above-mentioned means for determining the working conditions. The means for controlling the working apparatus control the working apparatus in accordance with the determined working conditions.

The fifth invention of the present application is a semiconductor device manufacturing method which is characterized by the fact that this method has a process in which wafers are worked using the working method of the third invention or the working system of the fourth invention.

In the present invention, the number of wafers used for adjustment is reduced; accordingly, the yield is improved, and the working time is shortened so that the throughput is improved. Moreover, since the working precision is improved, precise wafers can be manufactured, so that the yield in the exposure transfer process is improved.

The sixth invention of the present application is a computer program which describes the method for determining the working conditions that constitutes the second invention or a desirable aspect of the second invention.

The seventh invention of the present application is a computer program storage medium that stores the computer program of the sixth invention.

If the above-mentioned sixth invention or seventh invention is used, the second invention or a desirable aspect of the second invention can be worked using a computer, so that the working conditions can be quickly determined.

BRIEF DESCRIPTION OF THE DRAWINGS

FIG. 11 is a diagram which shows an example of a planarization technique in a semiconductor process.

BEST MODE FOR CARRYING OUT THE INVENTION

Preferred working configurations and embodiments of the present invention will be described below. However, the scope of the present invention is not limited by the contents of these descriptions.

In the following working configurations, the polishing (working) of the wafer constituting the object of polishing (object of working) is performed using a polishing body (tool) that has a smaller diameter than the wafer. In order to simplify the description, only the starting position of the swinging of the polishing body on the surface of the wafer and the swinging stroke will be considered as quantities that are manipulated. Besides these, actual quantities that can be manipulated also include the rotational speeds of the wafer and polishing body, the pressing pressure of the polishing body, and the swinging velocity, etc. If the examples described below are considered, a method to be used to manipulate these quantities will be easily determined by a person skilled in the art.

Figure 12:
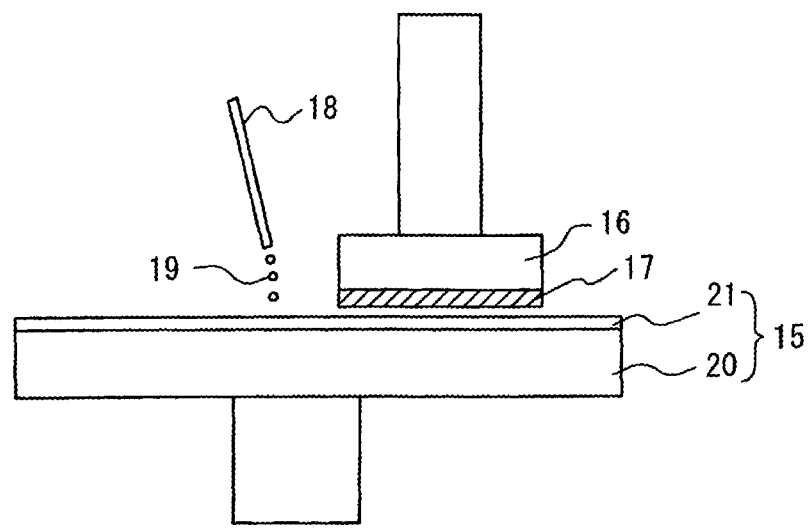
FIG. 12 is a schematic structural diagram of a polishing (planarization) apparatus used in CMP.
Figure 13:
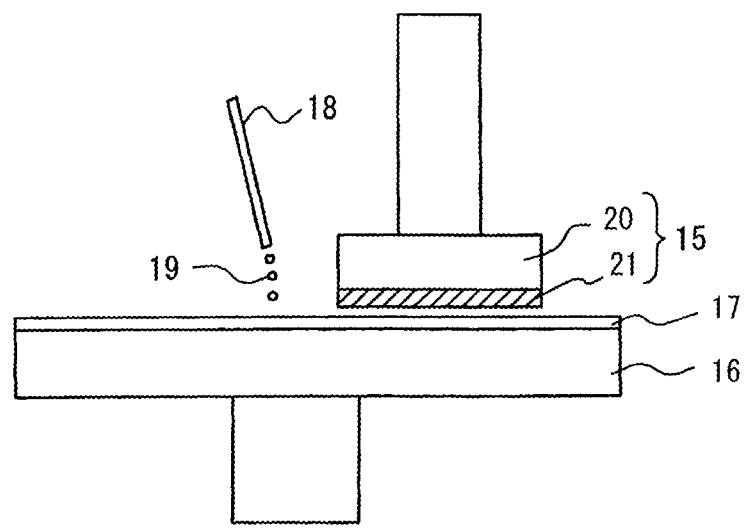
FIG. 13 is a schematic structural diagram of another polishing (planarization) apparatus used in CMP.

Not only a working apparatus such as that shown in FIG. 12, in which the polishing body is larger than the object of polishing, but also a working apparatus such as that shown in FIG. 13, in which the polishing body is smaller than the object of polishing, can be used as the subject polishing apparatus. As was described above, the effect of the present invention is especially great when the present invention is used in the latter type of polishing apparatus.

Here, polishing conditions constituting N elements will be considered. Specifically, the position on the surface of the wafer is designated as x, and the center position of the polishing body is designated as y. It is assumed that N element polishing conditions are set in which y of the polishing starting position is A(i), and in which the swinging stroke is B(i) (i=1~N), and that the amount of polishing (amount of working) of the wafer which is obtained when polishing is performed for a unit time under these conditions is taken as f(x,i). f(x,i) can be determined by simulation; however, determination by actual measurement is more accurate, and is therefore desirable.

When the amounts of polishing corresponding to the respective polishing conditions are thus determined, the amount of polishing $F_1(x)$ that is obtained when polishing is performed for the unit time $z_i$ under the ith polishing condition can be expressed as follows:

$$F_1(x) = \sum_{i=1}^{N} z_i f(x, i) \quad (2)$$

In the first working configuration of the present invention, when the polishing conditions are given, the worked shape (corresponding to the amount of polishing) that is obtained as a result is predicted. In this working configuration, when the polishing conditions are given, these working conditions are broken down into combinations of element working conditions. Then, the worked shape that is obtained is calculated using Equation (2).

In the method of the second working configuration of the present invention, when the desired worked shape is given, the working conditions that realize this worked shape are determined. In this method as well, x and f(x,i) are defined as described above.

The desired worked shape is converted into an amount of polishing, and is expressed or approximated as an integratable function G(x) for x. Furthermore, f(x,i) is also expressed or approximated as an integratable function for respective values of x. Then, with $c_i$ as a weight for the respective element working conditions, $c_i$ (i=1~N) is determined so that $$S = \int \left\{ G(x) - \sum_{i=1}^{N} c_i f(x, i) \right\}^2 dx \quad (3)$$

shows a minimum value. However, the integration range of Equation (3) is taken as the range of the area of the wafer that is to be polished. This is the method of least squares, and this value can be determined by solving the simultaneous equations:

$$\frac{\partial S}{\partial c_i} = 0 \quad (4)$$

$$(i = 1 \sim N)$$

In cases where these equations cannot be solved analytically, the equations may be solved by a numerical calculation method.

Thus, in cases where $c_i$ (i=1~N) is determined, the desired worked shape can be obtained by performing polishing for the unit time of $c_i$ under the ith working condition in each case. However, in cases where N is a large value, there is a possibility that the numerous different types of polishing will be required. In such cases, for small values of $c_i$, the desired worked shape is calculated without performing polishing under these conditions. Specifically, in such cases, $c_i$ is set equal to zero, and the following value is calculated:

$$F_2(x) = \sum_{i=1}^{N} c_i f(x, i) \quad (5)$$

Then, if the difference between G(x) and $F_2(x)$ is within permissible limits, this combination of working conditions is employed. Thus, the working conditions can be simplified.

Based on the above-mentioned description alone, it would appear that there must be an extremely large number of polishing conditions that constitute elements. In actuality, however, if the type of the object of polishing is determined, the number of types of final surface shapes for a single object of polishing is not that great, and what varies in this case is mainly the shape of the object of polishing prior to polishing. Therefore, in many cases, the polishing conditions that constitute elements are determined according to the type of the object of polishing and the type of the final surface shape, after which the combination of polishing conditions that constitute elements is varied according to variations in the shape of the object of polishing prior to polishing. Consequently, the number of polishing conditions constituting elements that are required for each type of object of polishing and each type of final surface shape is not that large; in most cases, several types are sufficient.

In cases where the desired worked shape (amount of polishing) or the amount of polishing (amount of working) f(x,i) under the working conditions that constitute elements cannot be expressed as functions in a form that can be integrated, the combinations of polishing conditions that constitute elements can be determined by utilizing a statistical procedure. For example, it is assumed that x adopts discrete values with Δx as units, and the value of f(x,i) is determined. Then, assuming that $c_i$ also adopts discrete values with $\Delta c_i$ as units, the following value corresponding to Equation (3) is determined for all combinations of x, i and $c_i$ under these conditions:

$$S = \sum \left\{ G(x) - \sum_{i=1}^{N} c_i f(x, i) \right\}^2 \quad (6)$$

The range of the initial sigma is the range of x constituting the object of polishing. Furthermore, combinations of $c_i$ which are such that S shows a minimum value are determined, and the polishing conditions that constitute elements are then combined on the basis of the processing described above.

If this is done, the number of calculations is increased. In cases where this is a problem, the following approach may be used: specifically, discrete $c_i$ with $\Delta c_i$ as units are generated as random numbers, and G(x) and $F_2(x)$ given by the above-mentioned Equation (5) are compared for each discrete x with Δx as an unit; then, in cases where it is found that the values of G(x) and $F_2(x)$ are within permissible limits for all x, these values are used as the combinations of $c_i$.

In cases where a human being participates in the determination, the system may be devised so that the shapes of G(x) and f(x,i) are compared, and the probability of $c_i$ being generated as a random number is determined based on the result of this comparison.

In the case of the above polishing conditions, the question in all instances is the time for which the polishing conditions constituting elements should be applied. If the application time is determined, then the question of how this application time is distributed in a time series can be freely determined. For example, in a case where the polishing condition constituting the first element is applied for 3 minutes, and the polishing condition constituting the second element is applied for 2 minutes, the polishing condition constituting the first element may be applied for the first 3 minutes, and the polishing condition constituting the second element may be applied for the next two minutes, or the polishing condition constituting the first element and the polishing condition constituting the second element may be alternately applied for one minute at a time, e.g., in the sequence first→second→first→second→first.

In the above example, both of the polishing conditions constituting elements are applied "as is"; however, polishing may be performed using other polishing conditions in which these polishing conditions constituting elements are combined. An example of this will be described below.

In this case as well, the method of combining the polishing conditions constituting elements that are to be applied is first determined by the method described above. Since the polishing conditions that constitute the respective elements are determined by the starting position of the swinging of the polishing body on the wafer and the swinging stroke as described above, the time for which the central axis of the polishing body is present in respective positions on the wafer can be calculated from these values. Specifically, in regard to the polishing condition constituting the ith element, the time for which the center position y of the polishing body is present in a given position can be viewed as q(y,i).

If this approach is adopted, then it would appear that in the case of the determined polishing conditions, the time Q(y) for which the central axis of the polishing body is present can be expressed as follows using $c_i$ determined by the method described above:

$$Q(y) = \sum_{i=1}^{N} c_i q(y, i) \quad (7)$$

Accordingly, a polishing method which is such that this Q(y) can be realized may be considered. As one example of a concrete method, the swinging speed of the polishing body at various positions on the wafer may be varied so that the time for which the central axis of the polishing body is present at y within one swinging time is proportional to Q(y). Specifically, this can be realized by slowing the swinging speed in positions where Q(y) is large, and increasing the swinging speed in positions where Q(y) is small. Furthermore, Q(y) can be realized by repeating the swinging a required number of times.

If the polishing conditions are determined in this way, the desired worked shape can be obtained by performing polishing in accordance with these conditions.

Figure 1:
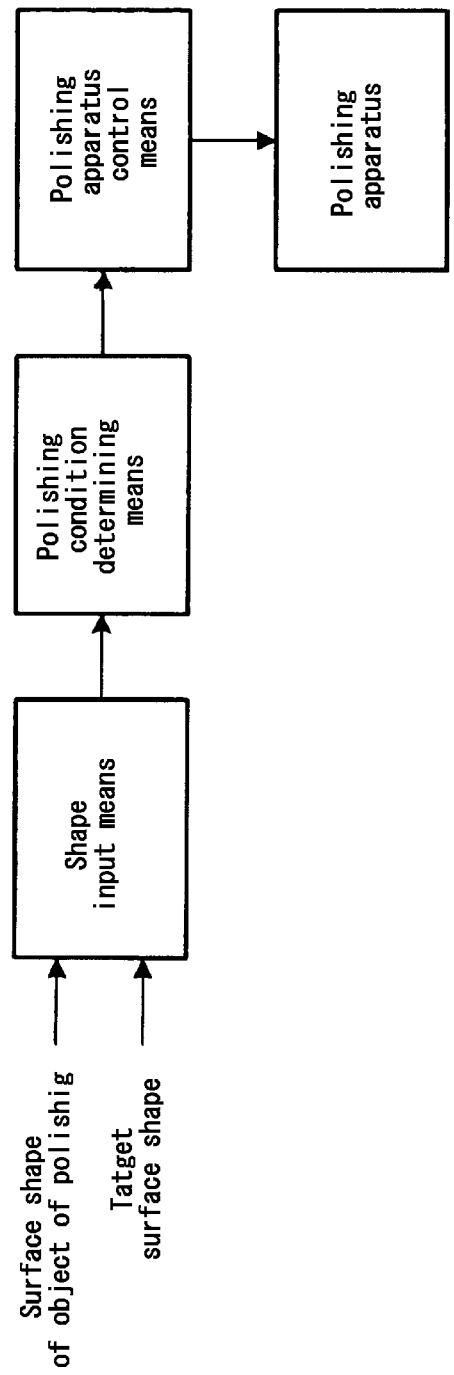
FIG. 1 is a diagram which shows the construction of a polishing system constituting one example of a working configuration of the present invention.

If means for determining the polishing conditions that realize the desired work shape when the desired work shape is given are thus realized, then a polishing system using such means can be constructed. An example is shown in FIG. 1.

The shape input means input the surface shape of the object of polishing prior to polishing, and the target surface shape. The target surface shape is supplied by manual input, or is supplied form a higher computer. In the case of the surface shape of the object of polishing prior to polishing, values measured by means of a measuring apparatus are input, or else the surface shape is supplied by manual input or from a higher computer. The target surface shape is given for each type of object of polishing. The surface shape of the object of polishing prior to polishing is given for each object of polishing or for each lot. The shape input means send these input values to the polishing condition determining means.

The relationship between the polishing conditions that constitute elements and the worked shape (amount of polishing) obtained by means of these polishing conditions is input beforehand into the polishing condition determining means along with the type of object of polishing, and polishing conditions (invariable polishing conditions) used in common for the polishing of this object of polishing. On the basis of these conditions, the polishing condition determining means determine the polishing conditions using the method of the present invention for determining polishing conditions.

Specifically, the above-mentioned polishing conditions that constitute elements are given as time series, and the swinging velocity corresponding to the swinging position is determined by converting combinations of the above-mentioned polishing conditions that constitute elements into variations in the swinging velocity of the polishing body (and in this way controlling the time for which the central axis of the polishing body is present).

The polishing apparatus control means input the polishing conditions determined by the polishing condition determining means, and control the polishing apparatus so that these conditions are realized.

The polishing condition determination method of the present invention can be realized by means of a computer if the above-mentioned algorithm is used. In this case, the polishing condition determination method is described as a computer program. If this program is stored on a computer program storage medium, the polishing conditions can be determined using a personal computer, etc. Accordingly, the target polishing can be accomplished by a human being giving commands to the polishing apparatus using these polishing conditions. Furthermore, the polishing condition determining means in FIG. 1 can be constructed using a computer, and in this case, such a program can be stored on the program storage medium of this computer.

Figure 2:
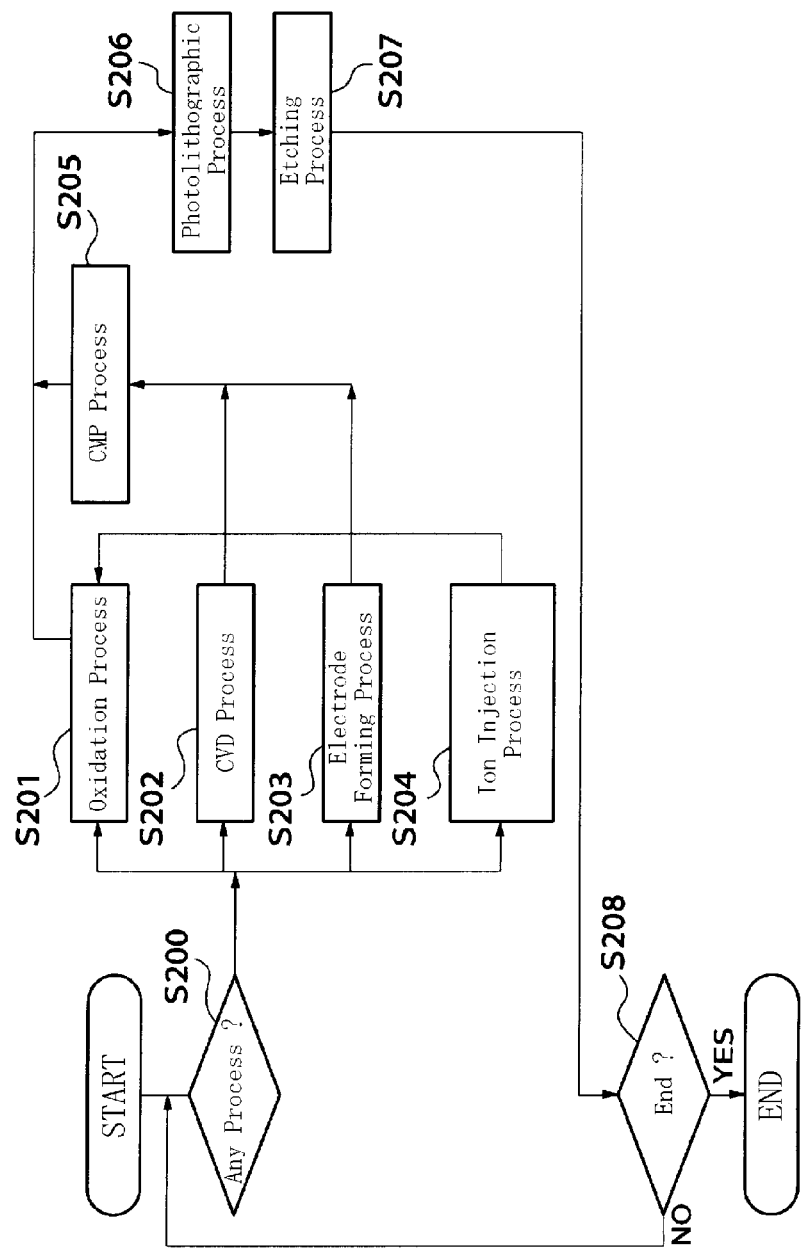
FIG. 2 is a flow chart which shows a semiconductor device manufacturing process constituting one example of a working configuration of the present invention.
Figure 3:
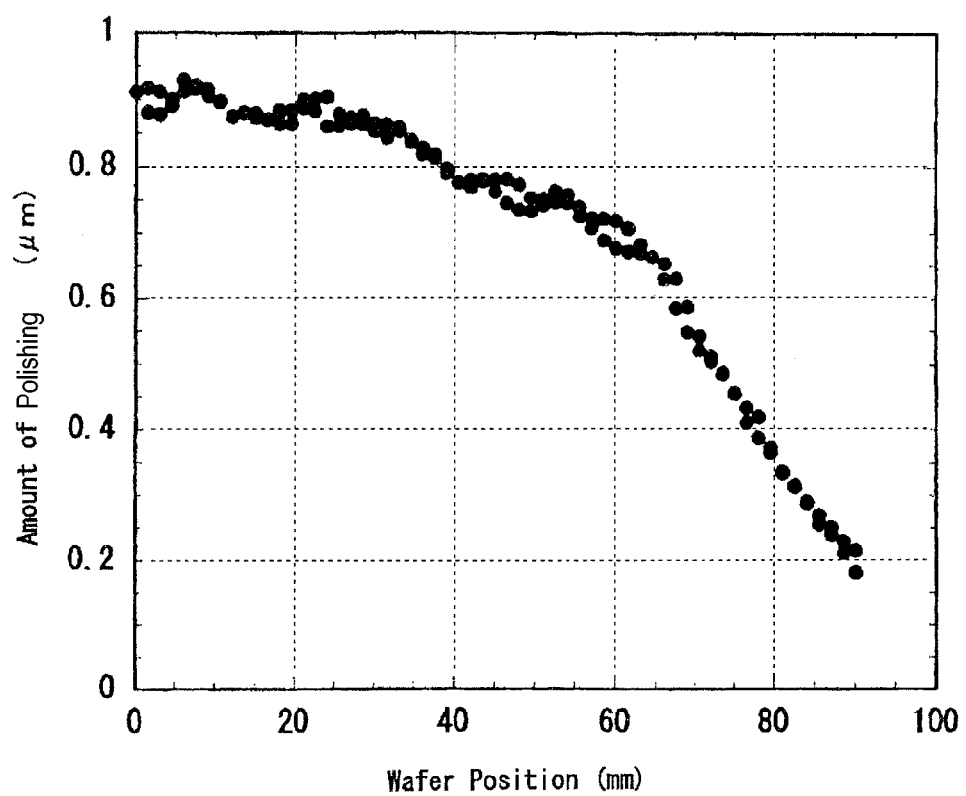
FIG. 3 is a diagram which shows the polishing profile obtained in a case where polishing was performed under the first element polishing conditions in an embodiment of the present invention (sample No. 1, starting position 23 mm, stroke 15 mm).
Figure 4:
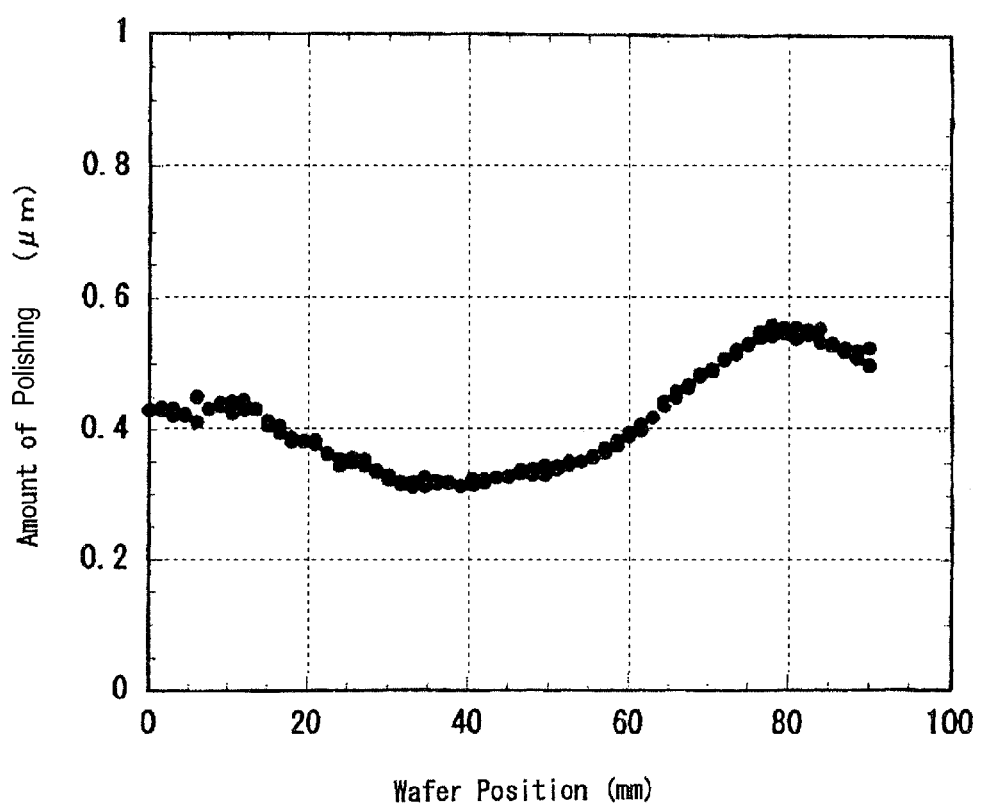
FIG. 4 is a diagram which shows the polishing profile obtained in a case where polishing was performed under the second element polishing conditions in an embodiment of the present invention (sample No. 2, starting position 38 mm, stroke 15 mm).
Figure 5:
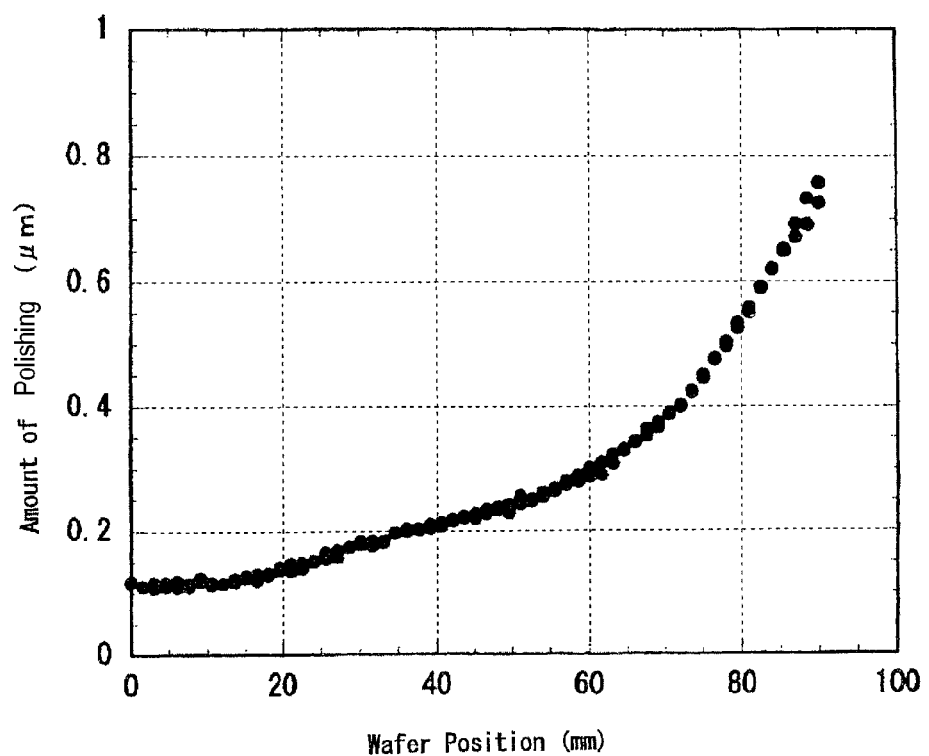
FIG. 5 is a diagram which shows the polishing profile obtained in a case where polishing was performed under the third element polishing conditions in an embodiment of the present invention (sample No. 3, starting position 53 mm, stroke 15 mm).
Figure 6:
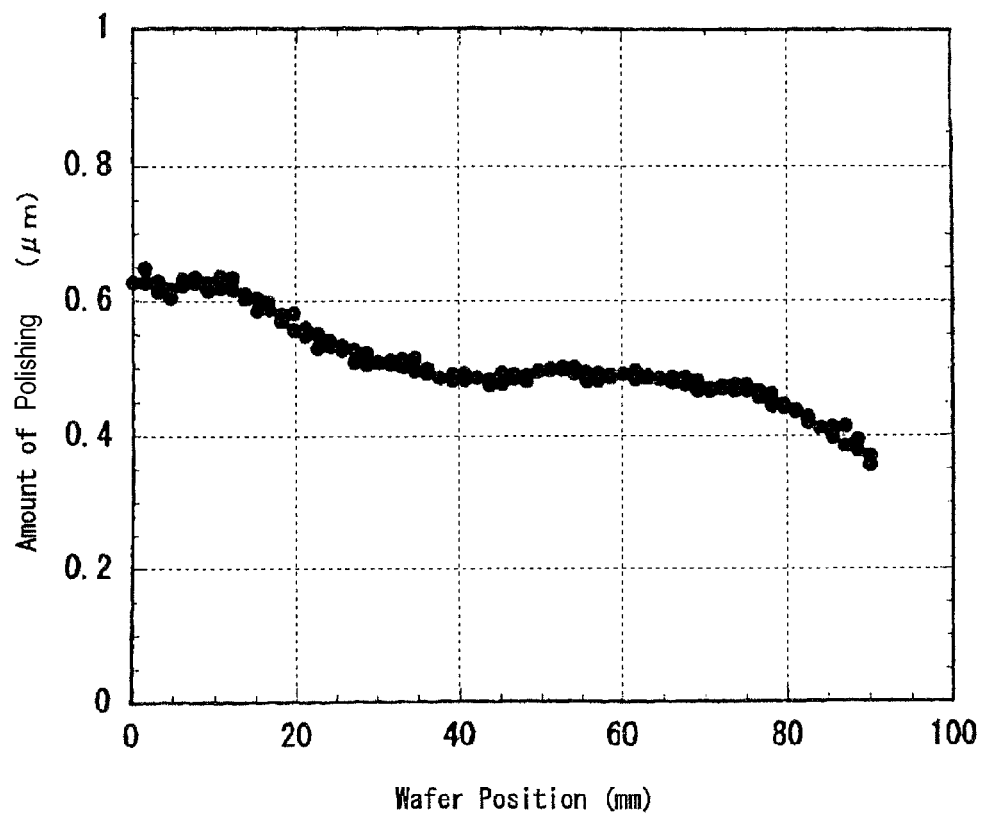
FIG. 6 is a diagram which shows the polishing profile obtained in a case where polishing was performed under the fourth element polishing conditions in an embodiment of the present invention (sample No. 4, starting position 23 mm, stroke 30 mm).
Figure 7:
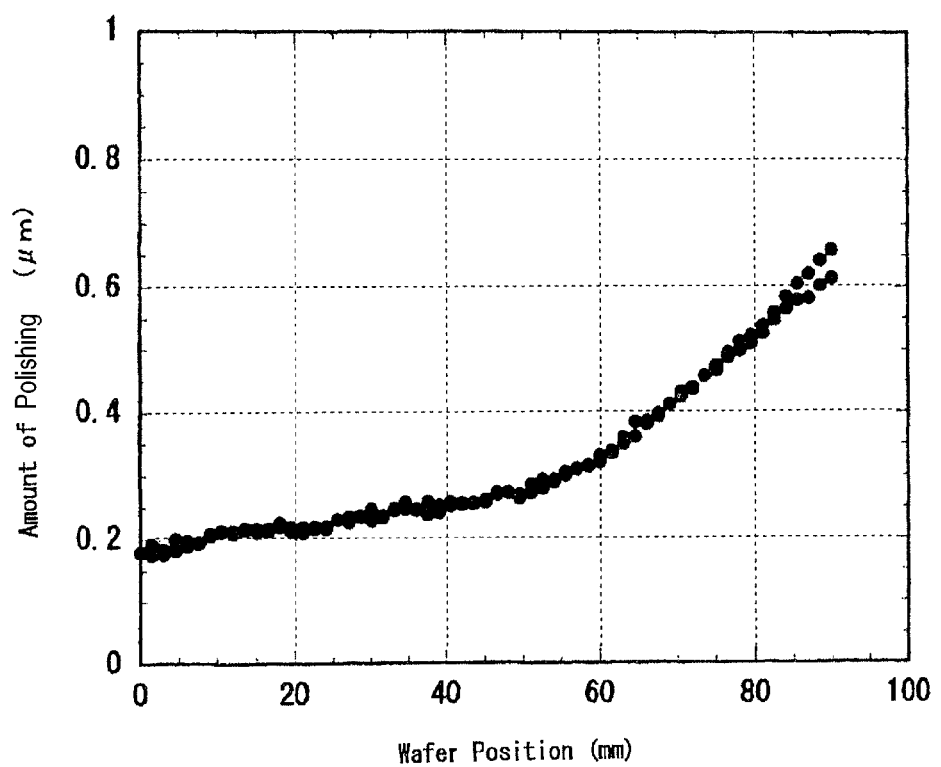
FIG. 7 is a diagram which shows the polishing profile obtained in a case where polishing was performed under the fifth element polishing conditions in an embodiment of the present invention (sample No. 5, starting position 38 mm, stroke 30 mm).
Figure 8:
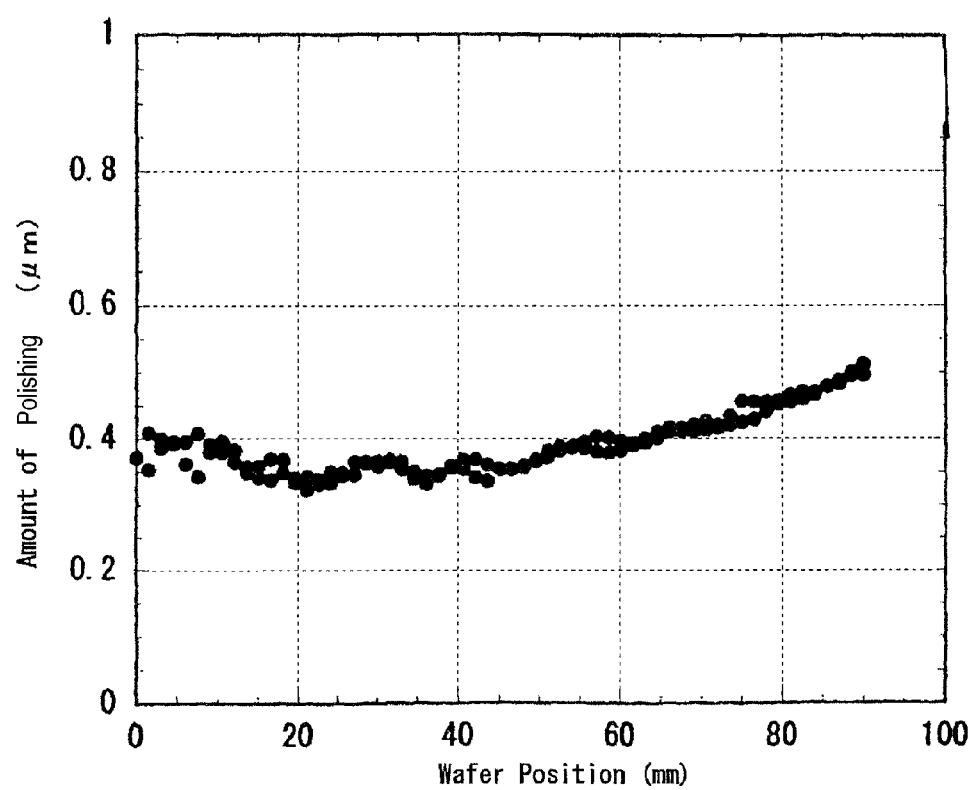
FIG. 8 is a diagram which shows the polishing profile obtained in a case where polishing was performed under the sixth element polishing conditions in an embodiment of the present invention (sample No. 6, starting position 23 mm, stroke 45 mm).

The semiconductor device manufacturing method in which the polishing method of the present invention is used will be described below. FIG. 2 is a flow chart which shows the semiconductor device manufacturing process. When the semiconductor device manufacturing process is started, the appropriate treatment process is first selected in step S200 from steps S201 through S204 described below. The processing proceeds to one of steps S201 through S204 according to the selection.

Here, step S201 is an oxidation process in which the surface of the wafer is oxidized. Step S202 is a CVD process in which an insulating film is formed on the surface of the wafer by CVD, etc. Step S203 is an electrode formation process in which electrodes are formed on the wafer by a process such as evaporation. Step S204 is an ion injection process in which ions are injected in the wafer.

Following the CVD process or electrode formation process, the processing proceeds to step S205. Step S205 is a CMP process. In this CMP process, the smoothing of an interlayer insulating film, or formation of a damascene by the polishing of the metal film on the surface of a semiconductor device, etc., is performed using the polishing apparatus of the present invention.

Following the CMP process or oxidation process, the processing proceeds to step S206. Step S206 is a photolithographic process. In the photolithographic process, the coating of the wafer with a resist, the baking of a circuit pattern onto the wafer by exposure using an exposure apparatus, and the development of the exposed wafer are performed. Furthermore, the next step S207 is an etching process in which the portions other than the developed resist image are removed by etching, after which the resist is stripped so that the resist that has become unnecessary following the completion of etching is removed.

Next, in step S208, a judgment is made as to whether or not all required processes have been completed, and if these processes have not been completed, the processing returns to step S200, and a circuit pattern is formed on the wafer by repeating the preceding steps. If it is judged in step S208 that all of the processes have been completed, the processing is ended.

In the semiconductor device manufacturing method constituting an embodiment of the present invention, the polishing method according to the present invention is used in the CMP process. Accordingly, wafers having the target surface shape can be manufactured with good yield and in a short period of time. As a result, semiconductor devices can be manufactured at a low cost compared to conventional semiconductor device manufacturing methods.

Embodiments

Embodiment 1

The polishing of a wafer with a diameter of 200 mm which had a Cu pattern inside was performed using a polishing apparatus in which the polishing pad was smaller than the wafer. This polishing was performed using an annular polishing pad with an external diameter of 150 mm and an internal diameter of 50 mm under the following conditions: head rpm 400 rpm, wafer rpm 200 rpm, polishing time 60 sec, slurry 100 ml (RD98052, FUJIMI Incorporated). The wafer had a film thickness of 1.5 µm, and the initial film thickness was extremely uniform.

Six wafers were polished under different polishing conditions determined by combinations of the swinging conditions (polishing starting position, amount of swinging), and six relationships between the polishing conditions constituting elements and the worked shape were determined. The polishing time was 60 seconds in all six sets of conditions. The relationships between the swinging conditions and the worked shapes (amounts of polishing) that were obtained are shown in FIGS. 3 through 8. In FIGS. 3 through 8, the horizontal axis indicates the wafer position, and the vertical axis indicates the amount of polishing in this position. In the section titled "Brief Description of the Drawings," the sample No. (No. of polishing conditions constituting elements), start position (polishing starting position) and stroke (amount of swinging) are indicated.

The target amount of polishing was set at 0.44 µm, and conditions for realizing a flat worked shape were determined by combinations of the above-mentioned six sets of polishing conditions constituting elements. In concrete terms, on the basis of the conditions obtained by actual polishing for a polishing time of 60 seconds, the worked shapes obtained when the polishing time was set at three-second increments (5% increments of 60 seconds, which was the polishing time when actual working conditions were obtained), i.e., 3 seconds, 6 seconds, . . . , 57 seconds, were first determined for each of the above-mentioned six sets of polishing conditions constituting elements. In this way, 21 sets of weighted polishing conditions and the worked shapes obtained in the case of these polishing conditions were obtained by adding the initial shape prior to polishing (polishing time of zero seconds) and the worked shape obtained in the case of a polishing time of 60 seconds to the worked shapes corresponding to polishing times of three-second increments obtained by the above-mentioned calculations from a single set of polishing conditions constituting elements.

Afterward, polishing times under the respective polishing conditions constituting elements were selected from the above-mentioned 21 sets for each set of polishing conditions constituting elements so that the sum of the polishing times when polishing was performed combining the above-mentioned six sets of polishing conditions constituting elements was 60 seconds, and the worked shapes obtained by all combinations of these polishing elements (e.g., all combinations such as 9 seconds under condition 1, 0 seconds under condition 2, 18 seconds under condition 3, 9 seconds under condition 4, 9 seconds under condition 5, and 15 seconds under condition 6) were determined, thereby discovering a combination of polishing conditions which was such that the sum of the squares of the differences between the determined worked shape and the target worked shape showed a minimum value.

Figure 9:
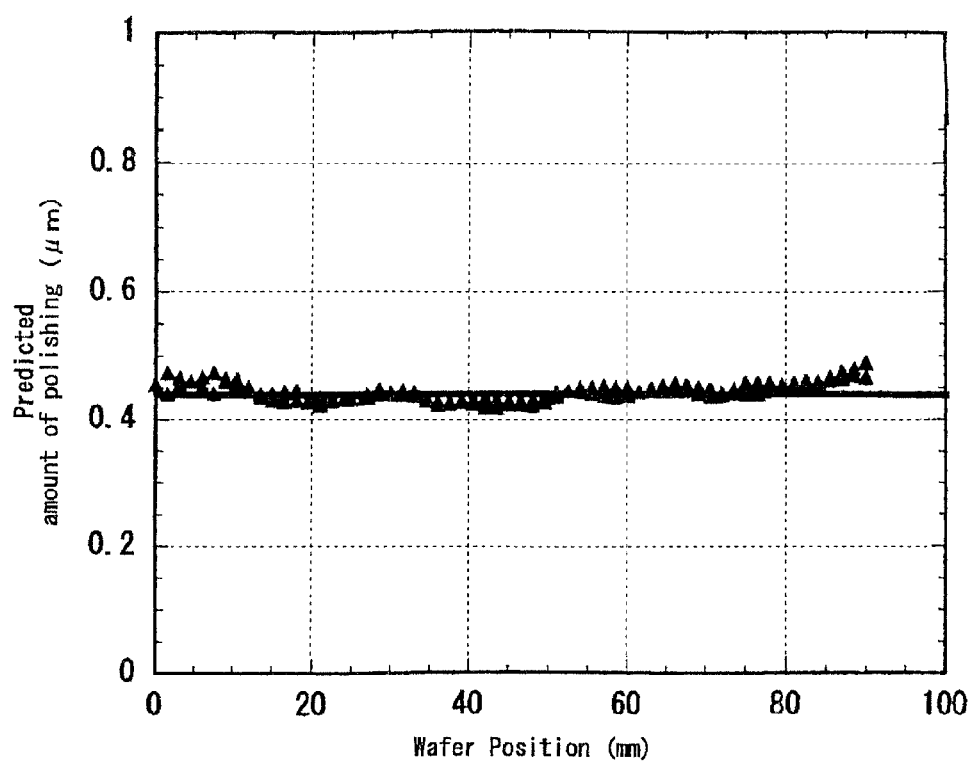
FIG. 9 is a diagram which shows an example of the predicted polishing profile in a case where polishing was performed under polishing conditions determined by calculation using a method for determining polishing conditions constituting one example of a working configuration of the present invention.

As a result, it was found that polishing of 0.44 µm with a flat worked shape can be obtained if polishing is performed for 12 seconds under condition 1, 12 seconds under condition 3, 6 seconds under condition 4, and 30 seconds under condition 6. The polishing profile obtained by these calculated results is shown in FIG. 9. In FIG. 9, the horizontal axis indicates the position on the wafer, and the vertical axis indicates the predicted amount of polishing obtained by calculation. The target amount of polishing is indicated by a straight line, and the calculated values are indicated by black triangles.

When polishing was performed in a time series under the respective conditions based on these results, a worked shape that showed extremely good agreement with the target was obtained. The uniformity was 2.4% at 1σ.

In this case, as was described above, the number of wafers required in order to determine the polishing conditions was six wafers. Thus, it was possible to reduce the number of wafers used in the determination of conditions by a considerable number compared to conventional methods. The time required for the series of operations was 1 hour, including preparation, polishing and measurement.

Embodiment 2

Figure 10:
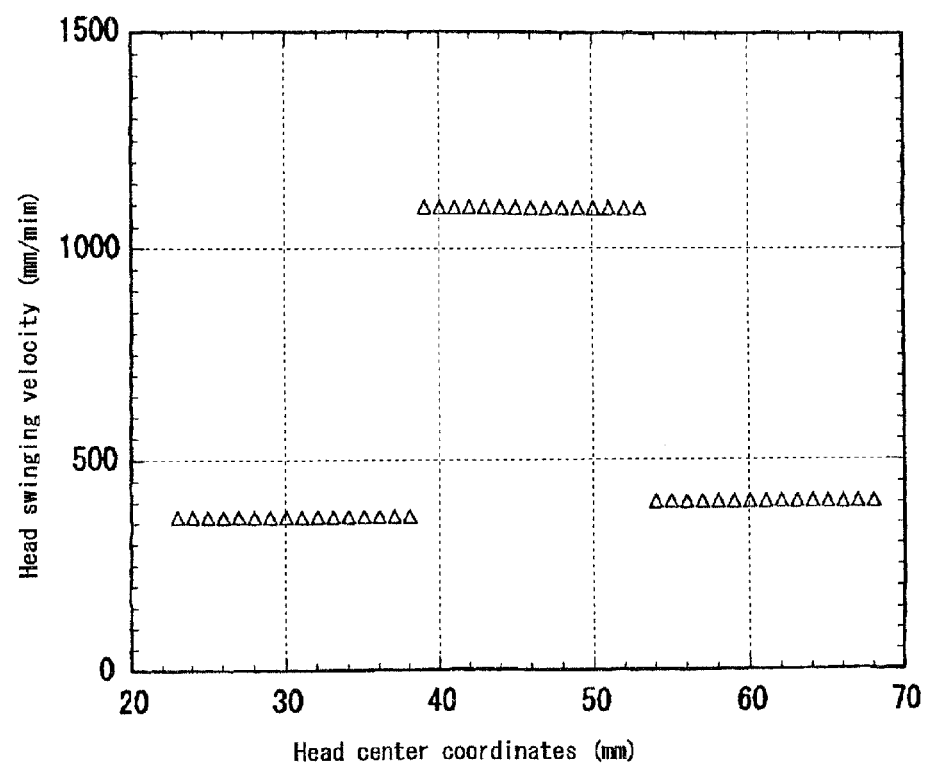
FIG. 10 is a diagram which shows an example of the results that were obtained when a combination of selected element working conditions was converted into a single swinging pattern (oscillation pattern).

Combinations of four of the conditions selected as conditions in Embodiment 1 were converted into a single swinging pattern from the probability of the presence of the center of the polishing pad. FIG. 10 shows the results obtained. In FIG. 10, the horizontal axis indicates the center coordinates of the head (corresponding to the wafer position), and the vertical axis indicates the swinging velocity. The triangles indicate the calculated values, and indicate swinging at the corresponding swinging velocity at the specified head center coordinates. The pattern shown in FIG. 10 indicates swinging at a swinging velocity of 364 mm/min when the head center coordinates are between 23 mm and 38 mm, swinging at a swinging velocity of 1092 mm/min when the head center coordinates are between 38 mm and 53 mm, and swinging at a swinging velocity of 401 mm/min when the head center coordinates are between 53 mm and 68 mm.

When polishing was performed under these conditions, polishing results that were more or less the same as those obtained in Embodiment 1 were obtained in the case of swinging for 7 reciprocating passes. The uniformity in this case was 2.5% at 1σ.

Embodiment 3

The polishing of a wafer with a diameter of 200 mm in which a Cu pattern was formed inside was performed using a polishing apparatus in which the polishing pad was smaller than the wafer. Cu wafers from a different wafer lot from that used in Embodiment 1 were used in the polishing of this embodiment. The wafer of this lot had a protruding shape in which the film thickness of the wafer was 1.6 μm in the central portion of the wafer, and 1.45 μm in the edge portions of the wafer.

For the wafers having this protruding film thickness distribution, the target residual film thickness was set at 0.9 μm, and conditions for realizing a flat worked shape were determined using combinations of the six sets of polishing conditions constituting elements used in Embodiment 1. The simulation method was the same as that used in Embodiment 1. As a result, it was found that polishing for 24 seconds under condition 1, 6 seconds under condition 3 and 30 seconds under condition 4 was favorable. When polishing was performed under these conditions, the residual film thickness was 0.9 μm, and polishing in which the uniformity of the residual film thickness was extremely high was possible. The uniformity of the residual film was 2.5% at 1σ. The time required for simulation, preparation, polishing and measurement in this series of polishing operations was 20 minutes.

Embodiment 4

In Embodiment 1, in spite of the fact that polishing was performed with a flat shape as the target shape, the shape that was obtained following actual polishing was as shown in FIG. 9. Accordingly, deviations from the target shape in respective wafer positions were calculated, the six sets of polishing condition elements indicated in Embodiment 1 were combined, and a combination was determined which was such that the polished shape obtained as a result of the above-mentioned combinations corresponded to the above-mentioned error components. Then, the probability of the presence of the center of the polishing pad was determined as in Embodiment 2 from a new combination of polishing condition elements obtained by adding the above-mentioned combination to the combination obtained in Embodiment 1, and the swinging velocity was determined from this probability of the presence of the center of the polishing pad.

As a result, conditions were obtained in which swinging was respectively performed at a swinging velocity of 414 mm/min when the head center coordinates were between 23 mm and 38 mm, a swinging velocity of 1092 mm/min when the head center coordinates were between 38 mm and 53 mm, and a swinging velocity of 351 mm/min when the head center coordinates were between 53 mm and 68 mm. When polishing was performed for 7 reciprocating passes under these conditions, the uniformity was improved to 1.7% at 1σ.

Embodiment 5

In determining the polishing conditions for performing polishing of the type shown in Embodiment 3, the six polishing condition elements used in Embodiment 1 were respectively subjected to a Fourier transform; furthermore, the amounts of polishing in respective portions of the wafer in a case where the residual film thickness was set at 0.9 μm were determined, and these polishing amounts were also subjected to a Fourier transform. Then, weighting was determined by the method of least squares so that the conditions obtained by adding this weighting to the six polishing condition elements that had been subjected to a Fourier transform most closely approached the values obtained by subjecting the polishing amounts to a Fourier transform. As a result, working conditions were obtained in which polishing was respectively performed for 25 seconds under condition 1 in Embodiment 1, 5 seconds under condition 3 and 30 seconds under condition 4. When polishing was performed under these conditions, the mean value of the residual film thickness was 0.9 μm, and the uniformity of the residual film thickness was 2.0% at 1σ. As a result of this polishing, the initial irregularity in the wafer thickness was sufficiently corrected.

Comparative Example 1

The polishing of a wafer with a diameter of 200 mm in which a Cu pattern was formed inside was performed using a polishing apparatus in which the polishing pad was smaller than the wafer. This polishing was performed using an annular polishing pad with an external diameter of 150 mm and an internal diameter of 50 mm under the following conditions: head rpm 400 rpm, wafer rpm 200 rpm, polishing time 60 sec, slurry 100 ml (RD98052, FUJIMI Incorporated). These are the same conditions as in Embodiment 1. The initial film thickness of the wafer showed an extremely high uniformity. The polishing conditions for realizing polishing that would produce a flat worked shape in one step using this wafer were determined by trial and error. 20 wafers were required in order to determine these conditions. The time required in order to determine the conditions was 4 hours.

Comparative Example 2

The polishing of a wafer with a diameter of 200 mm in which a Cu pattern was formed inside was performed using a polishing apparatus characterized by the fact that the polishing pad was smaller than the wafer. This polishing was performed using an annular polishing pad with an external diameter of 150 mm and an internal diameter of 50 mm under the following conditions: head rpm 400 rpm, wafer rpm 200 rpm, polishing time 60 sec, slurry 100 ml (RD98052, FUJIMI Incorporated). These are the same conditions as in Embodiment 1.

The initial film thickness of the wafer used in this case had a protruding shape in which the film thickness of the center shape was large. The polishing conditions for realizing a uniform residual film thickness using this wafer were determined by trial and error. 20 wafers were required in order to determine these conditions. The time required in order to determine the conditions was 6 hours.

As is also seen from Embodiment 1 and Embodiment 2 above, in cases where the same object of polishing and same slurry are used, the actual polishing conditions can be determined in most instances by using polishing conditions constituting elements prepared initially as basic conditions in common, and determining combinations of these conditions by simulation even if the shape that is to be worked varies. Accordingly, even in cases where a new worked shape is required, there is no need to determine the polishing conditions by trial and error each time.

In conventional methods, on the other hand, as is seen from Comparative Example 1 and Comparative Example 2, even when the same object of polishing and same slurry are used, the polishing conditions must be determined by trial and error each time that the working conditions change according to the wafer. Accordingly, the number of wafers required is large, and there is an extremely large amount of waste in terms of cost and process operation.

INDUSTRIAL APPLICABILITY

The present invention can be used to predict the worked shape, determine the working conditions and perform actual working in cases where mechanical working such as polishing or grinding is performed.

What is claimed is:

1. A method for predicting a worked shape that is obtained in cases where an object of working is worked by causing relative motion to take place between a tool and the object of working in a state in which abrasive grains are interposed between the tool and object of working, comprising:
    determining relationships between plural sets of working conditions, each of which constitutes an element, including at least one set of rotation speeds of the tool and the object of working, swinging conditions of the tool, and working pressure of the tool against the object of working and elements of worked shapes that are obtained when working is performed under each of the plural sets of working conditions,
    providing specified working conditions,
    representing the specified working conditions as a combination of the plural sets of working conditions each of which constitutes an element,
    determining a sum of elements of worked shapes each of which corresponds to each set of working conditions in the combination, and
    based on the sum, predicting a worked shape that will be obtained when working is performed under the specified working conditions,
    wherein the elements of worked shapes are subjected to a Fourier transform, the sum of the elements of worked shapes determined using the combinations is determined as a sum of the Fourier-transformed functions for these combinations, and the predicted worked shape is obtained by subjecting the sum of the Fourier-transformed functions to an inverse Fourier transform.

2. The worked shape prediction method according to claim 1, wherein the object of working is larger than the tool.

3. The worked shape prediction method according to claim 1, wherein the swinging conditions include a starting position of the tool and an amount of swinging of the tool.

4. The worked shape prediction method according to claim 3, wherein the working conditions that constitute elements are swinging conditions that constitute elements with other working conditions kept unchanged, the elements of worked shapes are represented as distributions of amount of polishing over radial positions of a wafer and the predicted worked shape is also represented as a distribution of amount of polishing over radial positions of the wafer.

5. A method for predicting a worked shape that is obtained in cases where an object of working is worked by causing relative motion to take place between a tool and the object of working in a state in which abrasive grains are interposed between the tool and object of working, comprising:
    determining relationships between plural sets of working conditions, each of which constitutes an element, including at least one set of rotation speeds of the tool and the object of working, swinging conditions of the tool, and working pressure of the tool against the object of working and elements of worked shapes that are obtained when working is performed under each of the plural sets of working conditions,
    providing specified working conditions,
    representing the specified working conditions as a combination of the plural sets of working conditions each of which constitutes an element,
    determining a sum of elements of worked shapes each of which corresponds to each set of working conditions in the combination, and
    based on the sum, predicting a worked shape that will be obtained when working is performed under the specified working conditions,
    wherein the swinging conditions include a starting position of the tool and an amount of swinging of the tool, and
    the working conditions that constitute elements are swinging conditions that constitute elements with other working conditions kept unchanged, the elements of worked shapes are represented as distributions of amount of polishing over radial positions of a wafer and the predicted worked shape is also represented as a distribution of amount of polishing over radial positions of the wafer.

6. The worked shape prediction method according to claim 5, wherein the object of working is larger than the tool.

* * * * *